United States Patent
Chau et al.

[11] Patent Number: 6,087,236
[45] Date of Patent: Jul. 11, 2000

[54] INTEGRATED CIRCUIT WITH MULTIPLE GATE DIELECTRIC STRUCTURES

[75] Inventors: Robert S. Chau, Beaverton; Reza Arghavani, Aloha; Bruce Beattie, Portland, all of Oreg.

[73] Assignee: Intel Corporation, Santa Clara, Calif.

[21] Appl. No.: 09/198,831

[22] Filed: Nov. 24, 1998

[51] Int. Cl.[7] ........................ H01L 21/336; H01L 21/8238
[52] U.S. Cl. .................................. 438/301; 438/231
[58] Field of Search ...................... 438/591, 301, 438/275, 302, 231, 212, 459, 29; 257/313, 344, 222; 365/185.02

[56] References Cited

U.S. PATENT DOCUMENTS

| | | | |
|---|---|---|---|
| 4,621,277 | 11/1986 | Ito et al. ........................ | 357/54 |
| 4,683,554 | 7/1987 | Lockwood et al. ........... | 365/185 |
| 4,980,307 | 12/1990 | Ito et al. ........................ | 437/40 |
| 5,258,323 | 11/1993 | Sarma et al. .................. | 437/63 |
| 5,344,524 | 9/1994 | Sharma et al. ................ | 156/630 |
| 5,422,296 | 6/1995 | Lage ............................... | 437/52 |
| 5,516,707 | 5/1996 | Loh et al. ...................... | 437/24 |
| 5,659,192 | 8/1997 | Sarma et al. .................. | 257/347 |
| 5,877,050 | 3/1999 | Gardner et al. ............... | 438/231 |
| 5,900,654 | 5/1999 | Spratt ............................. | 257/222 |
| 5,960,289 | 9/1999 | Tsui et al. ...................... | 438/275 |

*Primary Examiner*—John F. Niebling
*Assistant Examiner*—Walter L. Lindsay, Jr.
*Attorney, Agent, or Firm*—Raymond J. Werner

[57] ABSTRACT

An integrated circuit includes insulated gate field effect transistors (IGFETs), having gate dielectric layers wherein a nitrogen concentration in the gate dielectric varies between a first concentration at the gate electrode/gate dielectric interface and a second concentration at the gate dielectric/substrate interface. In one embodiment the gate dielectric is an oxynitride formed by an $N_2$ plasma; and the oxynitride has top surface nitrogen concentration that is higher than a bottom surface nitrogen concentration. In a further aspect of the present invention, an integrated circuit includes a plurality of IGFETs, wherein various ones of the plurality of IGFETs have different gate dielectric thicknesses and compositions. A method of forming IGFETs with different gate dielectric thicknesses and compositions, on a single integrated circuit, includes forming a first oxynitride layer, forming a masking layer, removing a portion of the first oxynitride layer, forming an oxide layer where the oxynitride was removed, and forming a plurality of gate electrodes, a first portion of the gate electrodes overlying the first oxynitride layer.

15 Claims, 4 Drawing Sheets

6,087,236

INTEGRATED CIRCUIT WITH MULTIPLE GATE DIELECTRIC STRUCTURES

BACKGROUND OF THE INVENTION

1. Field of the Invention

The present invention relates generally to semiconductor structures and manufacturing. More particularly the invention relates to the formation of multiple gate dielectric layer types for metal-oxide-semiconductor field effect transistors (MOSFETs).

2. Background

Advances in semiconductor manufacturing technology have led to the integration of millions of circuit elements, such as transistors, on a single integrated circuit (IC). In order to integrate increasing numbers of circuit elements onto an integrated it has been necessary to reduce the line widths of the various parts that make up an integrated circuit. Not only have interconnect line widths become smaller, but so have the dimensions of metal-oxide-semiconductor field effect transistors.

MOSFETs are also sometimes referred to as insulated gate field effect transistors (IGFETs). Most commonly, these devices are referred to simply as FETs, and are so referred to in this disclosure.

Transistor scaling typically involves more than just the linear reduction of the FET width and length. For example, both source/drain (S/D) junction depth and gate dielectric thickness are also typically reduced in order to produce a FET with the desired electrical characteristics. Similarly, when in use, these reduced scale FETs are operated with scaled down voltages.

However, various circuit and system design constraints sometimes make it desirable to operate with more than one voltage supply. Unfortunately, transistors that have been scaled down into the deep sub-micron region are not generally capable of operating with higher voltages such as those found in older generation systems. In particular, the very thin gate dielectric layers that are required for deep sub-micron transistors are susceptible to damage from the very high electric fields impressed across them when the higher supply voltages are applied to the FET gate terminals.

What is needed is an integrated circuit having both high voltage and low voltage transistors integrated thereon. What is further needed are methods of making such an integrated circuit.

SUMMARY OF THE INVENTION

Briefly, an integrated circuit includes insulated gate field effect transistors having gate dielectric layers, wherein a nitrogen concentration in the gate dielectric varies between a first concentration at the gate electrode/gate dielectric interface and a second concentration at the gate dielectric/substrate interface.

In a further aspect of the present invention, an integrated circuit includes a plurality of insulated gate field effect transistors, wherein various ones of the plurality of transistors have different gate dielectric thicknesses and compositions.

DETAILED DESCRIPTION

Terminology

Figure 1:
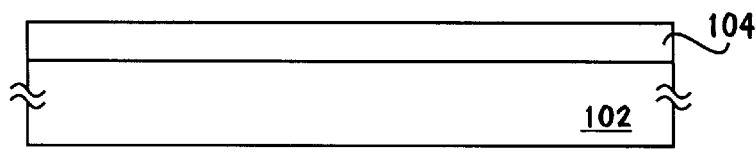
FIG. 1 is a schematic cross-sectional view of a wafer with a first oxide layer formed on the surface thereof.

The terms, chip, integrated circuit, monolithic device, semiconductor device, and microelectronic device, are often used interchangeably in this field. The present invention is applicable to all the above as they are generally understood in the field.

Historically, the material most commonly used in the semiconductor industry to form the gate insulator layer of a FET is silicon dioxide. Thus the gate insulator layer is frequently referred to simply as the gate oxide. The expression gate dielectric is also used to describe the gate insulator layer.

The term "gate" is context sensitive and can be used in two ways when describing integrated circuits. Gate refers to a circuit for realizing an arbitrary logical function when used in the context of a logic gate. However, as used herein, gate refers to the insulated gate terminal of a three terminal FET when used in the context of transistor circuit configurations or formation of transistor structures. The expression "gate terminal" is generally interchangeable with the expression "gate electrode". A FET can be viewed as a four terminal device when the semiconductor body is considered, for the purpose of describing illustrative embodiments of the present invention, the FET will be described using the traditional gate-drain-source, three terminal model.

Polycrystalline silicon is a nonporous form of silicon made up of randomly oriented crystallites or domains. Polycrystalline silicon is often formed by chemical vapor deposition from a silicon source gas or other methods and has a structure that contains large-angle grain boundaries, twin boundaries, or both. Polycrystalline silicon is often referred to in this field as polysilicon, or sometimes more simply as poly.

Source/drain terminals refer to the terminals of a FET, between which conduction occurs under the influence of an electric field, subsequent to the inversion of the semiconductor surface under the influence of a vertical electric field resulting from a voltage applied to the gate terminal. Generally, the source and drain terminals are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

Overview

In conventional integrated circuit processing, FETs are fabricated with a single gate dielectric thickness. Although there may be some slight variation in gate dielectric thickness across a wafer, typically the result of manufacturing anomalies, these differences in dielectric thickness are usually too small to make any substantial difference in the electrical characteristics of the FETs of an integrated circuit, particularly with respect to the ability of those FETs to withstand a higher operating voltage.

As is known in this field, the drain-to-source current of a FET, $I_{ds}$, in saturation is strongly dependent on the applied gate voltage. More particularly, in saturation mode, $I_{ds}$ is increased as the electric field across the gate dielectric is increased. Therefore, it is sometime desirable to provide increased gate voltage to achieve higher values of $I_{ds}$. Alternatively, multiple voltage ranges may need to processed by the FETs on an integrated circuit so that low power is operation may be achieved in some portions of the integrated circuit with a low voltage power supply, while other portions of the integrated circuit need to operate with a higher voltage power supply in order to interface to circuits that are operating at higher voltages. Various other design constraints and trade-offs may lead to the use of multiple voltage ranges on integrated circuits.

One way for a single integrated circuit to accommodate multiple supply voltages is to have multiple FET structures, each type of FET structure adapted to operate within a particular range of power supply voltages. Those FETs adapted to operate at a higher range of voltages must be able to withstand the electric fields impressed across the gate dielectric without rupturing or otherwise damaging the gate dielectric.

An integrated circuit includes insulated gate field effect transistors having gate dielectric layers, wherein a nitrogen concentration in the gate dielectric varies between a first concentration at the gate electrode/gate dielectric interface and a second concentration at the gate dielectric/substrate interface.

In a further aspect of the present invention, an integrated circuit includes a plurality of insulated gate field effect transistors, wherein various ones of the plurality of transistors have different gate dielectric thicknesses and compositions. For example, a first gate dielectric being 20 angstroms of oxynitride and a second gate dielectric being 5 angstroms of oxidized silicon; or a first gate dielectric being 33 angstroms of oxynitride and a second gate dielectric being 10 angstroms of oxidized silicon. Those skilled in the art and having the benefit of this disclosure will recognize that many such combinations are possible with the scope of the present invention.

In a still further aspect of the present invention, a method of forming transistors with different gate dielectric thicknesses and compositions, on a single integrated circuit, includes forming a first oxide layer, converting the first oxide layer to an oxynitride layer, forming a masking layer, patterning the oxynitride layer, forming a second dielectric layer, and forming a plurality of gate electrodes, a first portion of the gate electrodes overlying the oxynitride, and a second portion overlying the second dielectric.

Several illustrative embodiments of the present invention are described with reference to FIGS. 1–18.

A first illustrative embodiment provides a first FET having a gate dielectric of oxynitride, and a second FET having a gate dielectric of oxidized silicon. More particularly, FIGS. 1–7 illustrate the formation of a pair of FETs wherein, the first FET has an oxynitride layer having a first thickness as a gate dielectric, and the second FET has oxide layer of a second thickness as a gate dielectric layer. In this embodiment the oxynitride layer is thicker than the oxide layer.

To form an integrated circuit containing one or more FETs with a first gate dielectric structure and one or more FETs with a second dielectric structure in accordance with the present invention, various conventional, well-known semiconductor processing operations are first performed upon a substrate, such as a silicon wafer, up through the formation of an oxide layer on the surface of the wafer. Such conventional processing steps may include formation of isolation structures such as field oxide or shallow trench isolation oxide, formation of n-wells, formation of p-wells, and formation of sacrificial oxide layers (e.g., a chlorinated oxide layer approximately 150 angstroms thick which may used for cleaning the surface of silicon wafer prior to an formation of the gate dielectric).

Referring to FIG. 1, a schematic cross-sectional view of a wafer 102 with a first oxide layer 104 formed on a surface thereof is shown. Various processes for the formation of an oxide, suitable for use as a gate dielectric, are well known in this field. In the illustrative embodiment oxide layer 104 is less than or equal to 70 angstroms.

Figure 2:
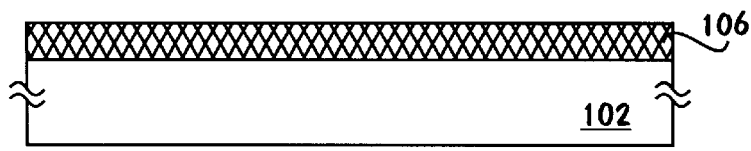
FIG. 2 is a schematic cross-sectional view of the structure of FIG. 1 after the first oxide layer is converted to an oxynitride layer by plasma nitridation.

In accordance with the present invention, and as shown in FIG. 2, is a schematic cross-sectional view of the structure of FIG. 1 after oxide layer 104 is converted to an oxynitride layer 106 by an $N_2$ plasma process. This plasma process nitridation is not a deposition, but rather an anneal process that changes the composition of the silicon dioxide layer to an oxynitride layer. This plasma nitridation process does not cause any significant change in the thickness of the dielectric layer. A plasma process in accordance with the present invention includes placing the wafer into an $N_2$ plasma ambient. More particularly, placing the wafer into a parallel plate plasma chamber with a spacing of between approximately 200 and 1000 mils; a gas flow of between approximately 0.5 and 3 liters/minute of $N_2$; an RF power between approximately 300 to 600 W; a pressure between approximately 1 to 5 Torrs; at a temperature of approximately 200 to 500° C., for approximately 10 to 90 seconds. The temperature is the temperature in the chamber and is achieved by heating with lamps. At thermal equilibrium, the wafer temperature is equal to the ambient temperature, which in turn, is equal to the chamber temperature.

In one embodiment, the spacing is approximately 400 mils; the gas flow is approximately 2 liters/minute of $N_2$; the RF power is approximately 400 W; the pressure is approximately 1.5 Torrs; the temperature is approximately 400° C., and the duration is approximately 40 seconds.

The conversion of oxide layer 104 into an oxynitride layer 106 by plasma nitridation results in a dielectric layer having a nitrogen distribution such that there is a first concentration of nitrogen at the top surface of layer 106 and a second concentration of nitrogen at the bottom surface of layer 106. Bottom surface of layer 106 refers to that portion of layer 106 that interfaces with substrate 102. Top surface of layer 106 refers to that portion of layer 106 which is furthest away from substrate 102. The first concentration is typically greater than or equal to 30 atomic %. The second concentration is typically less than or equal to 3 atomic %. The nitrogen concentration in oxynitride layer 106 generally decreases from the top surface to the bottom surface.

Figure 3:
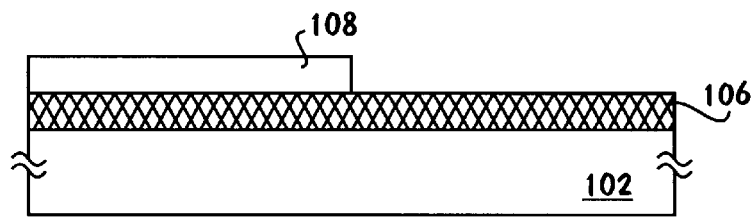
FIG. 3 is a schematic cross-sectional view of the structure of FIG. 2 after a photoresist has been patterned over the oxynitride layer.

FIG. 3 is a schematic cross-sectional view of the structure of FIG. 2 after a photoresist 108 has been patterned over oxynitride layer 106. Well-known methods and materials are used to form patterned photoresist layer 108. The photoresist is patterned in such a way that a first portion of oxynitride layer 106 is covered with photoresist, and a second portion of oxynitride layer 106 is exposed. Although photoresist 108 is disposed such that it is in direct contact with oxynitride layer 106 in the illustrated embodiment, those skilled in the art will recognize that there could be one or more other layers disposed between oxynitride layer 106 and overlying photoresist 108.

Figure 4:
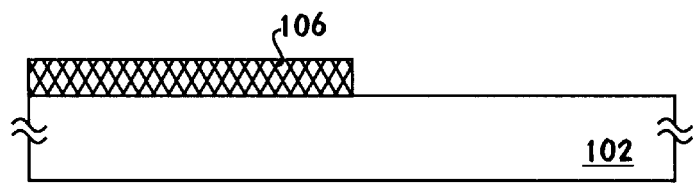
FIG. 4 is a schematic cross-sectional view of the structure of FIG. 3, after an exposed portion of the oxynitride is removed, and the photoresist is removed.

FIG. 4 is a schematic cross-sectional view of the structure of FIG. 3, after the removal of the exposed portion of oxynitride layer 106, and the subsequent removal of photoresist 108. The exposed portion of oxynitride layer 106 can be removed by wet etching in HF(0.1 wt. %), $NH_4F$(17 wt. %), and $H_2O$ (82.9 wt. %). In the illustrative embodiment, photoresist 108 is a common organic polymer photoresist, and is typically a positive photoresist. Photoresist 108 is removed by rinsing in a first tank of sulfuric acid, rinsing in a second tank of sulfuric acid, and subjecting the wafers to the well-known RCA 1 clean and an RCA 2 clean. The RCA 1 and RCA 2 cleans are used to remove any contaminants left behind after the two sulfuric acid cleans. Sulfuric acid is used because it dissolves photoresist. A double sulfuric acid clean is used to ensure that substantially all of photoresist 108 is dissolved. Each sulfuric acid clean is done in a separate acid tank, or bath, so that two tanks are used in this embodiment of the present invention. The RCA 1 clean consists of $H_2O_2$ (1 part), $NH_4OH$ (1 part), and $H_2O$ (5 parts). The RCA 2 clean consists of $H_2O_2$ (1 part), HCl (1 part), and $H_2O$ (5 parts). Since photoresist 108 dissolves in sulfuric acid, the length of a sulfuric acid clean process time can be adjusted to accommodate whatever resist thickness used.

Figure 5:
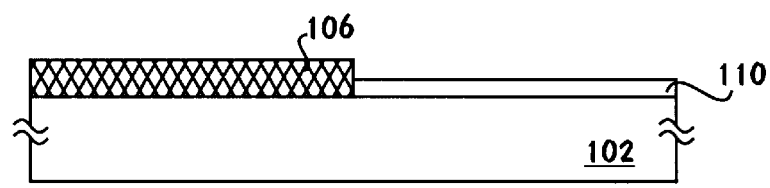
FIG. 5 is a schematic cross-sectional view of the structure of FIG. 4, after a second oxide layer, which is thinner than the oxynitride layer, is formed on a portion of the wafer surface that was exposed by removal of a portion of the oxynitride layer.

FIG. 5 is a schematic cross-sectional view of the structure of FIG. 4, subsequent to the formation of a second oxide layer 110, which is thinner than oxynitride layer 106. Second oxide layer 110 is formed on a portion of the wafer surface that was exposed by the removal of a portion of oxynitride layer 106. In the illustrative embodiment, second oxide layer 110 is less than approximately 20 angstroms. The thickness of oxynitride layer 106 is not affected, or not significantly affected, by the oxidation operation that forms second oxide layer 110.

Figure 6:
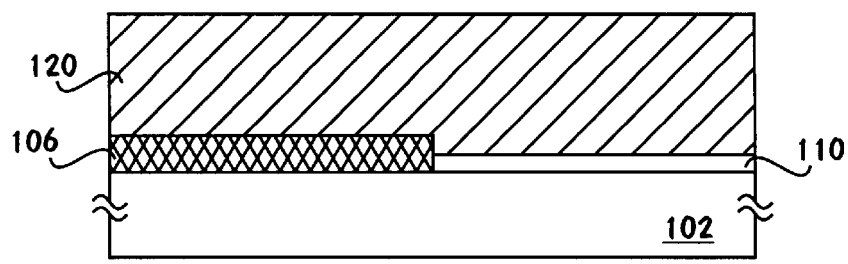
FIG. 6 is a schematic cross-sectional view of the structure of FIG. 5, after polysilicon has been deposited over the second oxide layer and the oxynitride layer.

FIG. 6 is a schematic cross-sectional view of the structure of FIG. 5, after a polysilicon layer 120 has been deposited over oxynitride layer 106 and second oxide layer 110.

Figure 7:
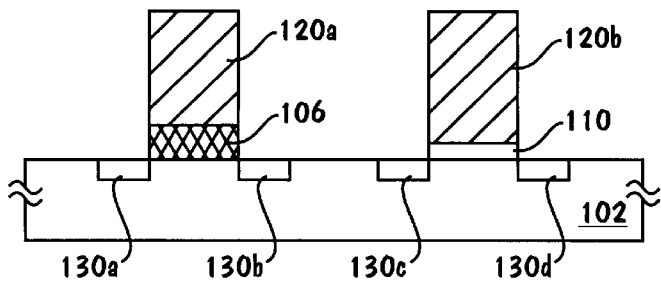
FIG. 7 is a schematic cross-sectional view of the structure of FIG. 6, after conventional processing operations are used to pattern the polysilicon to form gate electrodes and to further form source/drain terminals, thus completing FET structures.

FIG. 7 is a schematic cross-sectional view of the structure of FIG. 6, after conventional processing operations are used to pattern polysilicon layer 120 to form gate electrodes 120a, 120b, and to further form source/drain terminals 130a, 130b, 130c, 130d, thus completing FET structures with different gate dielectrics on the same integrated circuit. As can be seen in FIG. 7, a first FET has gate electrode 120a formed over oxynitride 106 and a second FET has gate electrode 120b formed over oxide 110. In this illustrated embodiment oxynitride 106 is thicker than oxide 110.

An alternative embodiment of the present invention provides FETs having oxynitride gate dielectric layers of different thicknesses. More particularly, FIGS. 1–5, and 8–9 illustrate the formation of a pair of FETs wherein, the first FET has a first oxynitride layer having a first thickness as a gate dielectric, and the second FET has a second oxynitride layer of a second thickness as a gate dielectric layer. In this embodiment the first oxynitride layer is thicker than the second oxynitride layer.

In this alternative embodiment, the manufacturing steps may be the same as those described above, in connection with FIGS. 1–5. However, it can be seen with reference to FIG. 8, that second oxide layer 110 is converted to a second oxynitride layer 111. The conversion of second oxide layer 110 to second oxynitride layer 111 is achieved by an $N_2$ plasma nitridation operation in a similar manner to that described above in connection with FIG. 3.

Figure 8:
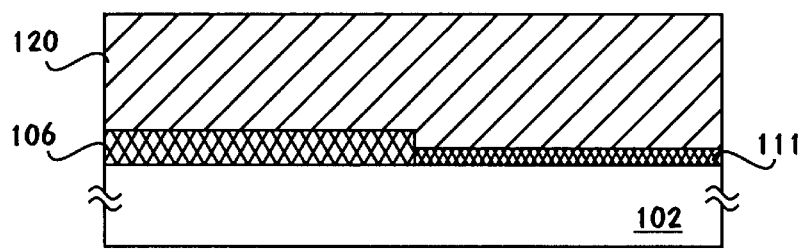
FIG. 8 is a schematic cross-sectional view of the structure of FIG. 5, after the second oxide layer has been converted to an oxynitride layer and a conductive layer has been deposited over the oxynitride layers.
Figure 9:
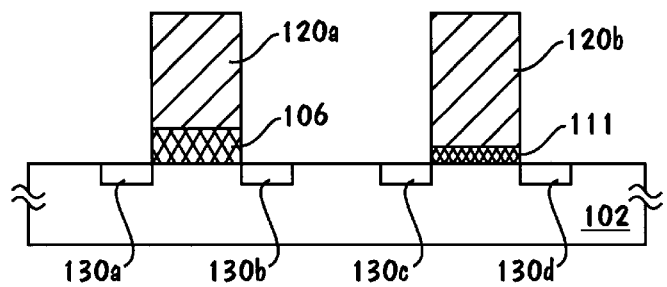
FIG. 9 is a schematic cross-sectional view of the structure of FIG. 8, after conventional processing operations are used to pattern the polysilicon to form gate electrodes and to further form source/drain terminals thus, completing FET structures.

FIG. 9 is a schematic cross-sectional view of the structure of FIG. 8, after conventional processing operations are used to pattern polysilicon layer 120 to form gate electrodes 120a, 120b, and to further form source/drain terminals 130a, 130b, 130c, 130d, thus completing FET structures with different gate dielectrics on the same integrated circuit. As can be seen in FIG. 9, a first FET has gate electrode 120a formed over first oxynitride 106 and a second FET has gate electrode 120b formed over second oxynitride 111. In this illustrated embodiment oxynitride 106 is thicker than oxynitride 111.

A further alternative embodiment of the present invention provides FETs having oxynitride/nitride stack gate dielectric layers, and FETs having oxide/nitride stack gate dielectric layers. More particularly, FIGS. 1–5, and 10–11 illustrate the formation of a pair of FETs wherein, the first FET has an oxynitride layer and a superjacent nitride layer as a gate dielectric, and the second FET has an oxide layer and a nitride layer as a gate dielectric. In this embodiment the oxynitride layer is thicker than the oxide layer.

In this alternative embodiment, the manufacturing steps may be the same as those described above, in connection with FIGS. 1–5. However, it can be seen with reference to FIG. 10, that a silicon nitride layer 112 is deposited over oxynitride layer 106 and oxide layer 110. Various silicon nitride deposition methods are well known in this field, and any suitable silicon nitride deposition method may be used to form nitride layer 112. Subsequent to the formation of silicon nitride 112, a layer of polysilicon 120 is deposited over silicon nitride 112.

Figure 10:
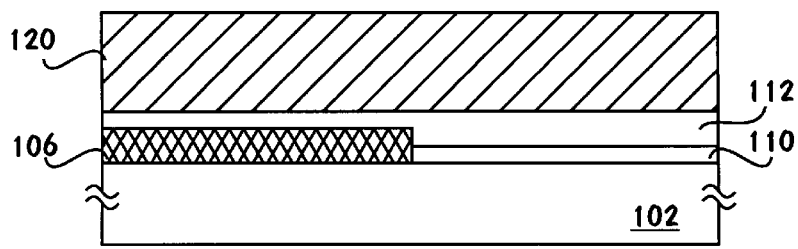
FIG. 10 is a schematic cross-sectional view of the structure of FIG. 5, after a nitride layer has been deposited over the oxynitride layer and the second oxide layer, and a conductive layer has been deposited over the nitride layer.
Figure 11:
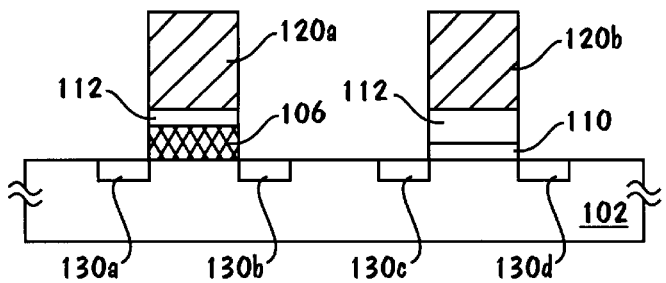
FIG. 11 is a schematic cross-sectional view of the structure of FIG. 10, after conventional processing operations are used to pattern the polysilicon to form gate electrodes and to further form source/drain terminals, thus completing FET structures.

FIG. 11 is a schematic cross-sectional view of the structure of FIG. 10, after conventional processing operations are used to pattern polysilicon layer 120 to form gate electrodes 120a, 120b, and to further form source/drain terminals 130a, 130b, 130c, 130d, thus completing FET structures with different gate dielectric layers on the same integrated circuit. As can be seen in FIG. 11, a first FET has gate electrode 120a formed over a dielectric stack of oxynitride 106 and nitride 112, while a second FET has gate electrode 120b formed over a dielectric stack of oxide 110 and nitride 112. In this illustrated embodiment oxynitride 106 is thicker than oxide 110.

The illustrative embodiments shown in FIGS. 1–11 each include a first oxynitride layer that is thicker than a subsequently formed second dielectric layer. Those skilled in the art and having the benefit of this disclosure will recognize that the subsequently formed dielectric layer may be thicker than the first oxynitride layer. Several illustrative embodiments of the present invention wherein the first oxynitride layer is thinner than the subsequently formed dielectric layer are described below in connection with FIGS. 1–4, and 12–18.

An alternative embodiment of the present invention provides FETs having oxynitride gate dielectric layers of a first thickness, and FETs having oxide gate dielectric layers of a second thickness. More particularly, FIGS. 1–4, and 12–14 illustrate the formation of a pair of FETs wherein, the first FET has a first oxynitride layer having a first thickness as a gate dielectric, and the second FET has a second oxynitride layer of a second thickness as a gate dielectric layer. In this embodiment the oxynitride layer is thinner than the oxide layer.

Figure 12:
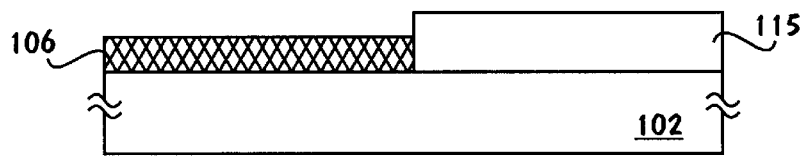
FIG. 12 is a schematic cross-sectional view of the structure of FIG. 4, after a second oxide layer, which is thicker than the oxynitride layer, is formed on a portion of the wafer surface that was exposed by removal of a portion of the oxynitride layer.

In this alternative embodiment, the manufacturing steps may be the same as those described above, in connection with FIGS. 1–4. After the removal of a first portion of oxynitride layer 106, and removal of photoresist 108, a second oxide layer 115, as can be seen with reference to FIG. 12, is formed. Second oxide layer 115 is thicker than oxynitride layer 106. The formation of second oxide layer 115 has no significant effect on the thickness of oxynitride layer 106.

Figure 13:
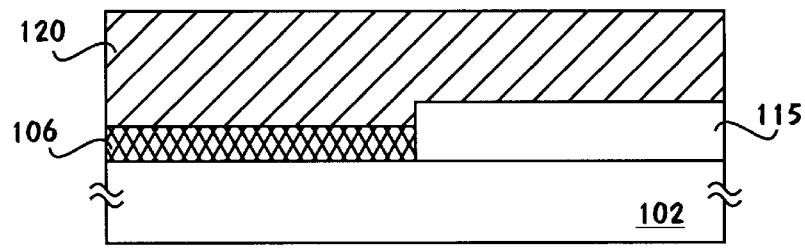
FIG. 13 is a schematic cross-sectional view of the structure of FIG. 12, after a conductive layer has been deposited over the oxynitride and second oxide layers.

FIG. 13 shows the structure of FIG. 12, after a layer of polysilicon 120 has been deposited over the surface of oxynitride 106 and oxide 115.

Figure 14:
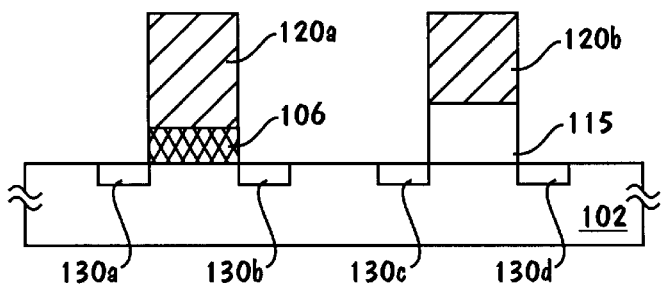
FIG. 14 is a schematic cross-sectional view of the structure of FIG. 13, after conventional processing operations are used to pattern the polysilicon to form gate electrodes and to further form source/drain terminals thus, completing FET structures.

FIG. 14 is a schematic cross-sectional view of the structure of FIG. 13, after conventional processing operations are used to pattern polysilicon layer 120 to form gate electrodes 120a, 120b, and to further form source/drain terminals 130a, 130b, 130c, 130d, thus completing FET structures with different gate dielectric layers on the same integrated circuit.

As can be seen in FIG. 14, a first FET has gate electrode 120a formed over oxynitride 106, while a second FET has gate electrode 120b formed over oxide 115. In this illustrated embodiment oxynitride 106 is thinner than oxide 110.

An further alternative embodiment of the present invention provides FETs having oxynitride gate dielectric layers of different thicknesses. More particularly, FIGS. 1–4, 12, and 15–16 illustrate the formation of a pair of FETs wherein, the first FET has a first oxynitride layer of a first thickness as a gate dielectric, and the second FET has a second oxynitride layer of a second thickness as a gate dielectric layer. In this embodiment the first oxynitride layer is thinner than the second oxynitride layer.

Figure 15:
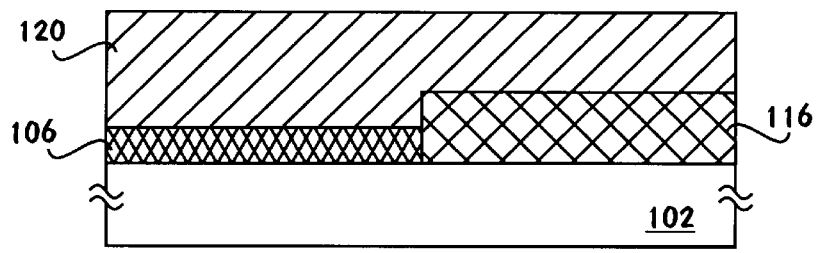
FIG. 15 is a schematic cross-sectional view of the structure of FIG. 12, after the second oxide layer has been converted to an oxynitride layer, and a conductive layer has been deposited over the oxynitride layers.

In this alternative embodiment, the manufacturing steps may be the same as those described above, in connection with FIGS. 1–4 and 12. As can be seen in FIG. 15, oxide layer 115 is converted to an oxynitride layer 116 by an $N_2$ plasma nitridation in a manner similar to that described in connection with FIG. 3. FIG. 15 further shows that a polysilicon layer 120 is deposited over oxynitride layers 115 and 116.

Figure 16:
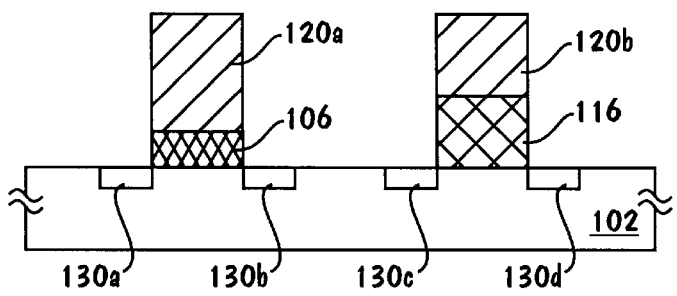
FIG. 16 is a schematic cross-sectional view of the structure of FIG. 15, after conventional processing operations are used to pattern the polysilicon to form gate electrodes and to further form source/drain terminals thus, completing FET structures.

FIG. 16 is a schematic cross-sectional view of the structure of FIG. 15, after conventional processing operations are used to pattern polysilicon layer 120 to form gate electrodes 120a, 120b, and to further form source/drain terminals 130a, 130b, 130c, 130d, thus completing FET structures with different gate dielectric layers on the same integrated circuit. As can be seen in FIG. 16, a first FET has gate electrode 120a formed over oxynitride 106, while a second FET has gate electrode 120b formed over oxynitride 116. In this illustrated embodiment oxynitride 106 is thinner than oxynitride 116.

A further alternative embodiment of the present invention provides FETs having oxynitride/nitride stack gate dielectric layers, and FETs having oxide/nitride stack gate dielectric layers. More particularly, FIGS. 1–4, 12, and 17–18 illustrate the formation of a pair of FETs wherein, the first FET has an oxynitride layer and a superjacent nitride layer as a gate dielectric, and the second FET has an oxide layer and a nitride layer as a gate dielectric. In this embodiment the oxynitride layer is thinner than the oxide layer.

In this alternative embodiment, the manufacturing steps may be the same as those described above, in connection with FIGS. 1–4 and 12. However, it can be seen with reference to FIG. 17, that a silicon nitride layer 112 is deposited over oxynitride layer 106 and oxide layer 115. Various silicon nitride deposition methods are well known in this field, and any suitable silicon nitride deposition method may be used to form nitride layer 112. Subsequent to the formation of silicon nitride 112, a layer of polysilicon 120 is deposited over silicon nitride 112 as is shown in FIG. 17.

Figure 17:
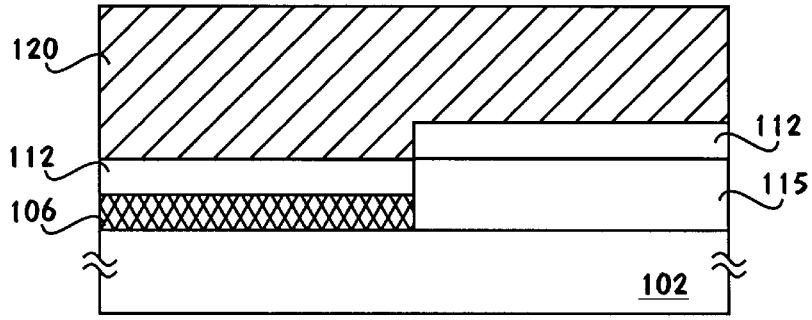
FIG. 17 is a schematic cross-sectional view of the structure of FIG. 12, after a nitride layer is deposited over the oxynitride layer and the second oxide layer; and a conductive layer has been deposited over the oxynitride and second oxide layers.
Figure 18:
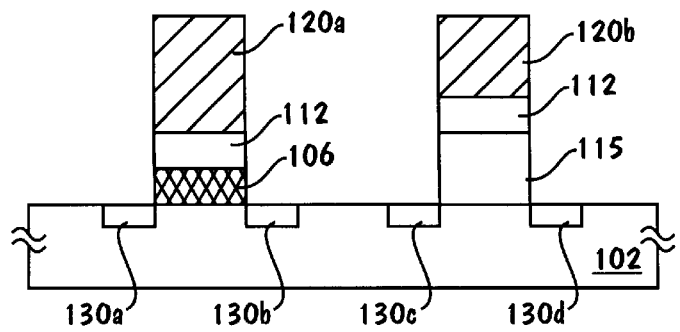
FIG. 18 is a schematic cross-sectional view of the structure of FIG. 17, after conventional processing operations are used to pattern the polysilicon to form gate electrodes and to further form source/drain terminals thus, completing FET structures.

FIG. 18 is a schematic cross-sectional view of the structure of FIG. 17, after conventional processing operations are used to pattern polysilicon layer 120 to form gate electrodes 120a, 120b, and to further form source/drain terminals 130a, 130b, 130c, 130d, thus completing FET structures with different gate dielectric layers on the same integrated circuit. As can be seen in FIG. 18, a first FET has gate electrode 120a formed over a dielectric stack of oxynitride 106 and nitride 112, while a second FET has gate electrode 120b formed over a dielectric stack of oxide 115 and nitride 112. In this illustrated embodiment oxynitride 106 is thinner than oxide 115.

Various other layers of insulators and conducting material are formed above the gate level, as is well understood in the field of semiconductor manufacturing and integrated circuit design.

Conclusion

Embodiments of the present invention provide integrated circuits including IGFETs having gate dielectric layers wherein a nitrogen concentration in the gate dielectric varies between a first concentration at the gate electrode/gate dielectric interface and a second concentration at the gate dielectric/substrate interface. In one embodiment the gate dielectric is an oxynitride formed by an $N_2$ plasma nitridation operation; and the oxynitride has top surface nitrogen concentration that is higher than a bottom surface nitrogen concentration.

In a further aspect of the present invention, an integrated circuit includes a plurality of IGFETs, wherein various ones of the plurality of IGFETs have different gate dielectric thicknesses and compositions. A method of forming IGFETs with different gate dielectric thicknesses and compositions, on a single integrated circuit, includes forming a first oxynitride layer, forming a masking layer, removing a portion of the first oxynitride layer, forming an oxide layer where the oxynitride was removed, and forming a plurality of gate electrodes, a first portion of the gate electrodes overlying the first oxynitride layer.

It will be recognized by those skilled in the art and having the benefit of this disclosure that the present invention is applicable to the formation of both n-channel FETs (NFETs) and p-channel FETs (PFETs).

An advantage of embodiments of the present invention is thickness control is improved for gate dielectric layers that are less than approximately 70 angstroms thick, as compared to thickness control generally achievable with an oxide/nitride stack formed by depositing silicon nitride over an oxide layer.

A further advantage of embodiments of the present invention is that the concentration of nitrogen at the top surface of the oxynitride layer protects that layer from contaminants in organic polymer photoresist.

A further advantage of embodiments of the present invention is that the concentration of nitrogen at the top surface of the oxynitride layer prevents that layer from further oxidation during the growth of a second oxide layer in certain portions of the substrate.

The present invention may be implemented with various changes and substitutions to the illustrated embodiments. For example, the present invention may be practiced with not only with silicon wafers as substrates, but also with other substrates, including but not limited to such substrates as silicon on insulator (SOI).

It will be readily understood by those skilled in the art and having the benefit of this disclosure, that various other changes in the details, materials, and arrangements of the materials and steps which have been described and illustrated in order to explain the nature of this invention may be made without departing from the principles and scope of the invention as expressed in the subjoined claims.

What is claimed is:

1. A method of making field effect transistors, comprising:
    forming an oxide layer on a substrate;
    converting the oxide layer to an oxynitride layer;
    removing a portion of the oxynitride layer and forming a second oxide layer on the surface of the substrate where the oxynitride layer was removed;
    forming a gate electrode layer over the oxynitride layer and the second oxide layer;
    patterning the gate electrode layer to form at least one gate electrode over the oxynitride and at least one gate electrode over the second oxide; and
    forming source/drain terminals adjacent the gate electrodes,
    wherein converting the oxide layer to the oxynitride layer comprises placing the substrate in a parallel plate plasma chamber with a plate spacing in the range of 200 to 1000 mils, an RF power in the range of 300 to 600 W, a gas flow in the range of 0.5 to 3 liters/minute of $N_2$, a pressure in the range of 1 to 5 Torrs, at a temperature in the range of 200 to 500° C., for the range of 10 to 90 seconds.

2. The method of claim 1, wherein the first concentration is greater than the second concentration.

3. The method of claim 1, wherein the first concentration is greater than approximately 30 atomic %.

4. The method of claim 1, wherein the second concentration is less than approximately 3 atomic %.

5. The method of claim 1, wherein the first concentration is greater than approximately 30 atomic %; and the second concentration is less than approximately 3 atomic %.

6. The method of claim 1, wherein converting the oxide layer to the oxynitride layer comprises plasma nitridation.

7. The method of claim 1, wherein converting the oxide layer to the oxynitride layer comprises placing the substrate in a parallel plate plasma chamber with a plate spacing of approximately 400 mils, an RF power of approximately 400 W, a gas flow of approximately 2 liters/minute of $N_2$, a pressure of approximately 1.5 Torrs, at a temperature of approximately 400° C., for approximately 40 seconds.

8. The method of claim 1, wherein removing the portion of the oxynitride layer comprises forming a masking layer over the oxynitride layer; patterning the masking layer; such that a portion of the oxynitride is exposed; etching the exposed portion of the oxynitride layer; rinsing the substrate in a first sulfuric acid bath; rinsing the substrate in a second sulfuric acid bath; performing an RCA 1 cleaning operation, and performing an RCA 2 cleaning operation.

9. The method of claim 8, wherein the RCA 1 cleaning operation comprises rinsing in a solution comprising 1 part $H_2O_2$, 1 part $NH_4OH$, and 5 parts $H_2O$; and the RCA 2 cleaning operation comprises rinsing in a solution comprising 1 part $H_2O_2$, 1 part HCl, and 5 parts $H_2O$.

10. A method of making an integrated circuit, comprising.
    forming a first oxide layer on a silicon substrate;
    converting the first oxide layer to an oxynitride layer;
    forming a patterned masking layer over the oxynitride layer such that a portion of the oxynitride is exposed;
    removing the exposed portion of the oxynitride layer such that a portion of the silicon substrate is exposed;
    forming a second oxide layer on the exposed silicon substrate, and
    subsequently forming a plurality of gate electrodes;
    wherein a first portion of the gate electrodes are disposed over the oxynitride layer, and a second portion of the gate electrodes are disposed over the oxide layer, and wherein converting the oxide layer to the oxynitride layer comprises placing the substrate in a parallel plate plasma chamber with a plate spacing in the range of 200 to 1000 mils, an RF power in the range of 300 to 600 W, a gas flow in the range of 0.5 to 3 liters/minute of $N_2$, a pressure in the range of 1 to 5 Torrs, at a temperature in the range of 200 to 500° C., for the range of 10 to 90 seconds.

11. The method of claim 10, wherein converting the first oxide layer to an oxynitride layer comprises nitridizing the first oxide layer in a nitrogen plasma.

12. The method of claim 10, wherein nitridizing the first oxide layer in a nitrogen plasma comprises placing the substrate in a parallel plate plasma chamber with a plate spacing of approximately 400 mils, an RF power of approximately 400 W, a gas flow of approximately 2 liters/minute of $N_2$, a pressure of approximately 1.5 Torrs, at a temperature of approximately 400° C., for approximately 40 seconds.

13. The method of claim 10, wherein the oxynitride layer has a thickness that greater than a thickness of the second oxide layer.

14. The method of claim 10, wherein the oxynitride layer has a thickness that is less than a thickness of the second oxide layer.

15. A method of making an integrated circuit, comprising:

forming a first oxide layer on a silicon substrate;

converting the first oxide layer to a first oxynitride layer;

forming a patterned masking layer over the first oxynitride layer such that a portion of the first oxynitride is exposed;

removing the exposed portion of the oxynitride layer such that a portion of the silicon substrate is exposed;

forming a second oxide layer on the exposed silicon substrate, the second oxide having a different thickness than the first oxide layer;

converting the second oxide layer to a second oxynitride layer; and subsequently forming a plurality of gate electrodes, wherein a first portion of the gate electrodes are disposed over the first oxynitride layer, and a second portion of the gate electrodes are disposed over the second oxynitride layer, and converting the oxide layer to the oxynitride layer comprises placing the substrate in a parallel plate plasma chamber with a plate spacing in the range of 200 to 1000 mils, an RF power in the range of 300 to 600 W, a gas flow in the range of 0.5 to 3 liters/minute of $N_2$, a pressure in the range of 1 to 5 Torrs, at a temperature in the range of 200 to 500° C., for the range of 10 to 90 seconds.

* * * * *